(12) United States Patent
McCoy

(10) Patent No.: US 8,745,203 B2
(45) Date of Patent: *Jun. 3, 2014

(54) MECHANICAL PROXIMITY SENSOR ENABLED ESERVICE CONNECTOR SYSTEM

(75) Inventor: Richard A. McCoy, Stevensville, MI (US)

(73) Assignee: Whirlpool Corporation, Benton Harbor, MI (US)

( * ) Notice: Subject to any disclaimer, the term of this patent is extended or adjusted under 35 U.S.C. 154(b) by 559 days.

This patent is subject to a terminal disclaimer.

(21) Appl. No.: 12/643,157

(22) Filed: Dec. 21, 2009

(65) Prior Publication Data

US 2011/0153821 A1 Jun. 23, 2011

(51) Int. Cl.
- *G06F 15/173* (2006.01)
- *G06F 15/16* (2006.01)
- *H04L 12/28* (2006.01)

(52) U.S. Cl.
USPC .......................... 709/224; 709/229; 370/254

(58) Field of Classification Search
USPC .................................. 709/224, 229; 370/254
See application file for complete search history.

(56) References Cited

U.S. PATENT DOCUMENTS

| | | | |
|---|---|---|---|
| 1,958,206 A | 5/1934 | Rubsam | |
| 3,101,984 A | 8/1963 | Wieckmann | |
| 3,258,553 A | 6/1966 | Breslin | |
| 3,561,506 A | 2/1971 | Johnson | |
| 3,710,060 A | 1/1973 | Brevick | |
| 4,068,179 A | 1/1978 | Sample et al. | |
| 4,148,536 A | 4/1979 | Petropoulsos et al. | |
| 4,317,969 A | 3/1982 | Riegler et al. | |
| 4,445,743 A | 5/1984 | Bakker | |
| 4,591,732 A | 5/1986 | Neuenschwander | |
| 4,604,505 A | 8/1986 | Henninger | |
| 4,663,542 A | 5/1987 | Buck et al. | |
| 4,844,582 A | 7/1989 | Giannini | |
| 4,964,891 A * | 10/1990 | Schaefer | 65/377 |
| 5,031,258 A | 7/1991 | Shaw | |
| 5,207,148 A | 5/1993 | Anderson et al. | |
| 5,368,275 A | 11/1994 | Ketcham et al. | |
| 5,385,468 A | 1/1995 | Verderber | |
| 5,433,623 A | 7/1995 | Wakata et al. | |
| 5,450,877 A | 9/1995 | Graffin | |
| 5,713,752 A | 2/1998 | Leong et al. | |
| 5,784,934 A | 7/1998 | Izumisawa | |
| 5,828,341 A | 10/1998 | Delamater | |
| 5,953,129 A | 9/1999 | Anderlik et al. | |
| 6,176,718 B1 | 1/2001 | Skarie et al. | |
| 6,183,264 B1 | 2/2001 | Harsanyi | |
| 6,350,148 B1 | 2/2002 | Bartolutti et al. | |
| 6,359,270 B1 | 3/2002 | Bridson | |

(Continued)

FOREIGN PATENT DOCUMENTS

| | | |
|---|---|---|
| EP | 0868077 A2 | 9/1998 |
| JP | 60033716 A | 2/1985 |

(Continued)

*Primary Examiner* — Jeong S Park

(57) ABSTRACT

An eService connector system includes an eService consumer for receiving an eService from an eService source. The eService may, for example, be any wave form of illumination, acoustic or thermal service. A service switch is provided for selectively transferring the eService from the eService source to the eService consumer. The service switch is activated to transfer an eService from the eService source to the eService consumer in response to a proximity sensor engaging a proximity target.

14 Claims, 5 Drawing Sheets

(56) References Cited

U.S. PATENT DOCUMENTS

| | | |
|---|---|---|
| 6,428,334 B1 | 8/2002 | Skarie et al. |
| 6,445,580 B1 | 9/2002 | Cohen et al. |
| 6,534,951 B2 | 3/2003 | Kawashima |
| 6,559,882 B1 | 5/2003 | Kerchner |
| 6,633,157 B1 | 10/2003 | Yamaki et al. |
| 6,685,491 B2 | 2/2004 | Gergek |
| 6,921,113 B1 | 7/2005 | Vlasblom |
| 6,927,871 B1 | 8/2005 | Silverbrook et al. |
| 6,969,928 B2 | 11/2005 | Hanson |
| 6,973,936 B2 | 12/2005 | Watson |
| 6,981,695 B1 | 1/2006 | Hedlund et al. |
| 6,986,263 B2 | 1/2006 | Crisp, III |
| 7,024,717 B2 | 4/2006 | Hilscher et al. |
| 7,201,005 B2 | 4/2007 | Voglewede et al. |
| 7,207,080 B2 | 4/2007 | Hilscher et al. |
| 7,207,233 B2 | 4/2007 | Wadge |
| 7,209,038 B1 | 4/2007 | Deconinck et al. |
| 7,264,026 B2 | 9/2007 | Gruber et al. |
| 7,291,032 B1 | 11/2007 | Carver et al. |
| 7,354,292 B1 | 4/2008 | Lloyd et al. |
| 7,404,298 B2 | 7/2008 | Kim et al. |
| 7,430,111 B2 | 9/2008 | Lee et al. |
| 7,493,926 B2 | 2/2009 | Weglin |
| 7,584,030 B1 | 9/2009 | Graham |
| 7,618,295 B2 | 11/2009 | McCoy |
| 7,625,246 B2 | 12/2009 | McCoy et al. |
| 7,639,485 B2 | 12/2009 | McCoy |
| 7,651,368 B2 | 1/2010 | Kendall et al. |
| 7,686,127 B2 | 3/2010 | LeClear et al. |
| 7,689,476 B2 | 3/2010 | Crisp, III |
| 7,713,090 B2 | 5/2010 | Kendall et al. |
| 7,740,505 B2 | 6/2010 | McCoy |
| 7,740,506 B2 | 6/2010 | McCoy |
| 7,748,494 B2 | 7/2010 | Leclear et al. |
| 7,751,184 B2 | 7/2010 | McCoy |
| 7,765,332 B2 | 7/2010 | McCoy et al. |
| 7,798,865 B2 | 9/2010 | McCoy et al. |
| 7,810,343 B2 | 10/2010 | McCoy et al. |
| 7,814,944 B2 | 10/2010 | Weglin |
| 7,826,203 B2 | 11/2010 | McCoy |
| 7,841,907 B2 | 11/2010 | McCoy |
| 7,843,697 B2 | 11/2010 | McCoy et al. |
| 7,852,619 B2 | 12/2010 | McCoy |
| 7,865,639 B2 | 1/2011 | McCoy et al. |
| 7,869,201 B2 | 1/2011 | McCoy et al. |
| 7,870,753 B2 | 1/2011 | Marcy et al. |
| 7,871,300 B2 | 1/2011 | McCoy et al. |
| 7,898,812 B2 | 3/2011 | McCoy et al. |
| 7,903,397 B2 | 3/2011 | McCoy |
| 7,916,336 B2 | 3/2011 | Silverbrook et al. |
| 7,931,114 B2 | 4/2011 | LeClear et al. |
| 7,934,958 B2 | 5/2011 | Kendall et al. |
| 7,980,088 B2 | 7/2011 | LeClear et al. |
| 8,008,586 B2 | 8/2011 | Kuehl et al. |
| 8,035,958 B2 | 10/2011 | Kendall et al. |
| 8,040,666 B2 | 10/2011 | McCoy et al. |
| 8,151,016 B2 | 4/2012 | McCoy |
| 8,212,430 B2 | 7/2012 | McCoy |
| 8,314,678 B2 | 11/2012 | Ebrom et al. |
| 8,342,480 B2 * | 1/2013 | Hendrickson et al. ........ 251/149 |
| 2001/0017134 A1 | 8/2001 | Bahr |
| 2002/0022991 A1 * | 2/2002 | Sharood et al. ................ 705/14 |
| 2003/0037447 A1 | 2/2003 | Gruber et al. |
| 2003/0154338 A1 | 8/2003 | Boz et al. |
| 2003/0221616 A1 | 12/2003 | Carpenter et al. |
| 2004/0036273 A1 | 2/2004 | McClary |
| 2004/0154318 A1 | 8/2004 | Roh et al. |
| 2004/0202421 A1 | 10/2004 | Iiduka et al. |
| 2005/0011205 A1 | 1/2005 | Holmes et al. |
| 2006/0021659 A1 | 2/2006 | Andersson |
| 2006/0053655 A1 | 3/2006 | Weglin |
| 2006/0118694 A1 | 6/2006 | Lee et al. |
| 2006/0125360 A1 | 6/2006 | Kim et al. |
| 2006/0145576 A1 | 7/2006 | Lee et al. |
| 2006/0168236 A1 | 7/2006 | Higuma et al. |
| 2006/0187080 A1 | 8/2006 | Slatter |
| 2007/0086151 A1 | 4/2007 | Oh et al. |
| 2008/0065289 A1 | 3/2008 | Bertosa et al. |
| 2008/0122585 A1 | 5/2008 | Castaldo et al. |
| 2008/0125911 A1 | 5/2008 | Ebrom et al. |
| 2008/0158172 A1 * | 7/2008 | Hotelling et al. .............. 345/173 |
| 2008/0164224 A1 | 7/2008 | McCoy et al. |
| 2008/0164225 A1 | 7/2008 | McCoy |
| 2008/0164226 A1 | 7/2008 | McCoy et al. |
| 2008/0164227 A1 | 7/2008 | LeClear et al. |
| 2008/0164796 A1 | 7/2008 | McCoy et al. |
| 2008/0165282 A1 | 7/2008 | Marcy et al. |
| 2008/0165474 A1 | 7/2008 | McCoy et al. |
| 2008/0165475 A1 | 7/2008 | McCoy et al. |
| 2008/0165476 A1 | 7/2008 | McCoy et al. |
| 2008/0165478 A1 | 7/2008 | McCoy |
| 2008/0165505 A1 | 7/2008 | McCoy et al. |
| 2008/0165509 A1 | 7/2008 | Kendall et al. |
| 2008/0165998 A1 | 7/2008 | LeClear et al. |
| 2008/0166895 A1 | 7/2008 | McCoy et al. |
| 2008/0166915 A1 | 7/2008 | Kendall et al. |
| 2008/0168205 A1 | 7/2008 | McCoy et al. |
| 2008/0192411 A1 | 8/2008 | McCoy |
| 2008/0201032 A1 | 8/2008 | Fayyad et al. |
| 2008/0222327 A1 | 9/2008 | McCoy et al. |
| 2008/0231464 A1 | 9/2008 | Lewis et al. |
| 2008/0231764 A1 | 9/2008 | Kendall et al. |
| 2008/0232053 A1 | 9/2008 | Kendall et al. |
| 2008/0247141 A1 | 10/2008 | Kendall et al. |
| 2008/0265191 A1 | 10/2008 | Walborn |
| 2008/0287009 A1 | 11/2008 | McCoy |
| 2009/0009316 A1 | 1/2009 | Kendall et al. |
| 2009/0047824 A1 | 2/2009 | Seibert et al. |
| 2009/0050232 A1 | 2/2009 | Guan et al. |
| 2009/0054804 A1 | 2/2009 | Gharib et al. |
| 2009/0161579 A1 * | 6/2009 | Saaranen et al. .............. 370/254 |
| 2010/0007325 A1 | 1/2010 | Stark |
| 2010/0024573 A1 * | 2/2010 | Daverman et al. ........ 73/862.626 |
| 2010/0052866 A1 * | 3/2010 | Elferich et al. .............. 340/10.5 |
| 2010/0120284 A1 | 5/2010 | Oka et al. |
| 2010/0182753 A1 | 7/2010 | Kendall et al. |
| 2010/0248546 A1 | 9/2010 | McCoy |
| 2010/0281261 A1 | 11/2010 | Razzell |
| 2011/0049308 A1 | 3/2011 | Beaman et al. |
| 2011/0073214 A1 | 3/2011 | Guan et al. |
| 2011/0146328 A1 | 6/2011 | Hendrickson et al. |
| 2011/0146329 A1 | 6/2011 | Kuehl et al. |
| 2011/0146330 A1 | 6/2011 | Kuehl et al. |
| 2011/0146819 A1 | 6/2011 | Hendrickson et al. |
| 2011/0147159 A1 | 6/2011 | Kuehl et al. |
| 2011/0147160 A1 | 6/2011 | Kuehl et al. |
| 2011/0147161 A1 | 6/2011 | Kuehl et al. |
| 2011/0147417 A1 | 6/2011 | Kuehl |
| 2011/0148216 A1 | 6/2011 | McCoy |
| 2011/0148223 A1 * | 6/2011 | McCoy ........................ 307/116 |
| 2011/0148649 A1 * | 6/2011 | de Cavalcanti et al. .... 340/686.6 |
| 2011/0148650 A1 * | 6/2011 | Jenkins et al. ............. 340/686.6 |
| 2011/0148651 A1 | 6/2011 | Hendrickson et al. |
| 2011/0149485 A1 | 6/2011 | Kuehl et al. |
| 2011/0152024 A1 | 6/2011 | Kuehl |
| 2011/0153739 A1 * | 6/2011 | McCoy ........................ 709/204 |
| 2011/0153821 A1 | 6/2011 | McCoy |
| 2011/0153871 A1 | 6/2011 | Ferragut, II et al. |
| 2011/0153880 A1 | 6/2011 | McCoy |

FOREIGN PATENT DOCUMENTS

| | | |
|---|---|---|
| JP | 06310202 A | 11/1994 |
| JP | 06310204 A | 11/1994 |
| JP | 06333633 A | 12/1994 |
| JP | 2007080584 A | 3/2007 |
| WO | 2007/015274 A1 | 2/2007 |

* cited by examiner

MECHANICAL PROXIMITY SENSOR ENABLED ESERVICE CONNECTOR SYSTEM

BACKGROUND

Traditionally, appliances, consumer electronics devices, and other useful household equipment had been located in different rooms dedicated to the function supported by the appliance, consumer electronic device, and/or household equipment. The kitchen has traditionally been limited to a space for preparing and eating meals and consequently has mostly been occupied by cabinetry and large home appliances such as refrigerators, dishwashers, and ovens. The family room has been designated as a place for leisure activities, and so most entertainment devices, such as televisions and video games are commonly found here. Laundry rooms normally house a clothes washing machine, dryer, and iron. Devices such as personal computers and printers are often located in another room, such as a dedicated home office or bedroom.

Consumers increasingly own multiple hand-held or portable consumer electronic devices, such as laptops, cell phones, PDA's, and digital music players. These devices are typically used in many different rooms in the house and are often carried from room to room throughout the home. Consumers tend to eat, meet and entertain in the kitchen, not just in the dining room and family room. In fact, the kitchen is often the hub of most household activity. Consumers also tend to work in every room of the home with the adoption of laptop computers and wireless networks. Therefore, there is a trend for consumers to perform non-traditional functions in a household room designed for a traditional function. The present invention recognizes this trend and attempts to support the trend.

BRIEF SUMMARY

The present disclosure describes eService connector systems for connecting portable devices to a host.

According to one aspect of the invention, a system receives a first eService communicating device having a first eService connector component and a first contact proximity coupling device and comprises a second eService communicating device. The second eService communicating device comprises a main body, an eService consumer associated with the main body, an eService line having a first end coupled with the eService consumer and a second end remote from the first end, a second eService connector component coupled with the second end of the eService line, the second eService connector component being operably engageable with the first eService connector component to permit the communication of an eService between the first and second eService connector components, and a second contact proximity coupling device operably associated with the second eService connector component, the second contact proximity coupling device being configured to engage the first contact proximity coupling device when the first and second eService connector components are engaged to selectively permit the communication of the eService between the first eService communicating device and the second eService communicating device.

According to another aspect of the invention, an eService connector system connects a first eService communicating device and a second eService communicating device, and comprises an eService connector component capable of communicating an eService, an service switch operably connected to the eService connector component for selectively permitting the eService to be transmitted to the eService connector component, and a proximity sensor operably connected to the service switch and engageable with a proximity target, wherein the service switch causes the eService to be transmitted to the eService connector component when the proximity sensor engages the proximity target.

According to yet another aspect of the invention, an eService system comprises a first eService communicating device having a first eService connecting component, a second eService communicating device having a second eService connecting component, a contact proximity system comprising a proximity target associated with the first eService communicating device and a proximity sensor associated with the second eService communicating device, and a service switch operably coupled to the proximity sensor, the service switch being controllable by the proximity sensor in response to detection of the proximity target, wherein eService communication is selectively permitted between the first and second eService connecting components in response to the service switch.

According to still another aspect of the invention, a system is used in association with a host having an eService provider, a first eService connector component, and a service switch selectively providing an eService to the first eService connector component in response to a proximity sensor engaging a proximity target, and in association with an eService consumer. The system comprises a second eService connector component engagable with the first eService connector component, an eService line interconnecting the eService consumer and the second eService connector component, and a proximity target capable of engaging the proximity sensor to activate the service switch.

According to still another aspect of the invention, an adapter removably couples a portable device having a first device eService connector component to a host having an eService provider, a first host eService connector component that cannot be directly connected to the first device eService connector component, and an service switch selectively providing an eService to the first host eService connector component in response to a proximity sensor engaging a proximity target. The adapter comprises a second host eService connector component engageable with the first host eService connector component, a second device eService connector component engageable with the first device eService connector component, an eService line interconnecting the second host eService connector component and the second device eService connector component for the transfer of an eService therealong, and a proximity target capable of engaging the proximity sensor to actuate the service switch.

DETAILED DESCRIPTION

Figure 1:
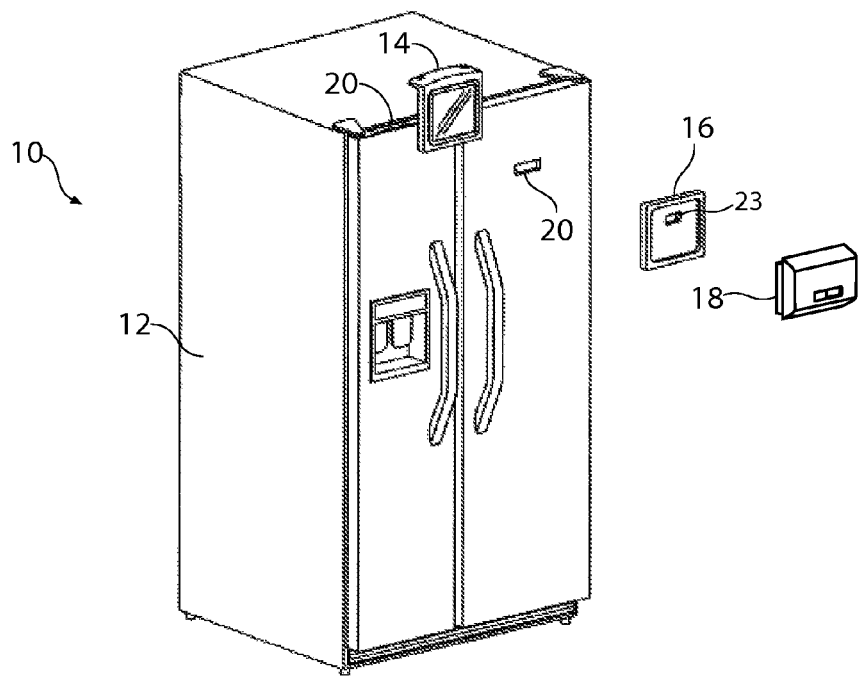
FIG. 1 is a perspective view of a modular system according to one embodiment of the invention employing a mechanically energized eService connector system for connecting an accessory device to a host.

Referring now to the discussion that follows and also to the drawings, illustrative approaches to the disclosed systems and methods are shown in detail. Although the drawings represent some possible approaches, the drawings are not necessarily to scale and certain features may be exaggerated, removed, or partially sectioned to better illustrate and explain the present invention. Further, the descriptions set forth herein are not intended to be exhaustive or to otherwise limit or restrict the claims to the precise forms and configurations shown in the drawings and disclosed in the following detailed description.

The drawings and the following detailed description relate generally to systems of eService connector systems for coupling an eService provider with an eService consumer.

In the drawings, generally, a service provider within a host creates a first service, which is delivered to an eService transmitter. The first service may be delivered to the transmitter in any appropriate form, which may be used by the transmitter, such as in the form of electrical power, an electromagnetic wave, mechanical power, or a compression wave, for example. If the first service is an eService, the eService transmitter may simply transmit the eService as received or may modify it in form, such as frequency, type, intensity, polarity, etc. If the first service is not in the form of an eService, then the eService transmitter or another device between the service provider and the eService transmitter uses the first service to create the eService for transmission.

A eService receiver associated with an accessory device receives the eService and either consumes the eService, retransmits the eService, or provides a second service to a service consumer associated with the accessory device. If the service consumer is an eService consumer, then the eService receiver may simply retransmit or pass the received eService to the eService receiver or may modify it in form. If the service consumer is not an eService consumer, then the eService receiver or another device uses the eService to create the service used by the service consumer.

The following definitions apply to terms that may be used in the specification and the claims, unless otherwise noted.

As used herein, an "eService" is a useful wave-based functionality, such as thermal energy, illumination, and sound, which may be communicated from one device to another device. An eService may be provided continuously, for specified times, for specified amounts, and/or for the duration of certain events, such as the duration of a user function or a device operation, to provide sound, heat, cooling, or illumination.

A "service" is a useful functionality that may be communicated from one device to another device, and can include an eService, but can also include other useful functionalities such as electrical power, electronic data, mechanical support, mechanical power, mechanical motion, fluid power, or a substance, as well as others.

The term "coupled", and any variation thereof, as used herein, includes any type of connection that permits transfer of a service, such as an eService, between two devices. The term "coupled" does not require a physical connection between the two devices, so long as the coupling permits transfer of an eService. The term "coupled" includes both fixed and removable coupling as well as both continuous and intermittent coupling.

The term "communication", and any variation thereof, as used herein, is the coupling of two devices to supply a service, including an eService, from at least one of the devices to the other of the devices, such as through directly connected electronic lines or plumbing lines, or through contactless communication (also referred to as contactless transmission). Contactless communication can include any types of contactless service communication, including, without limitation for illustration purposes, electromagnetic transmission, acoustical transmission, and magnetic fields. Service communication includes supplying or receiving any service. As used herein, communication of eService includes both uni-directional and multi-directional communication between any two devices, either directly or through an adapter, as defined herein.

"EService communication" as used herein is the communication of an eService including any coupling of two devices to supply an eService from at least one of the devices to the other of the devices through a contact or contactless coupling, and includes acoustic, thermal and illumination communication.

"Illumination communication" as used herein is the coupling of two devices to supply illumination from at least one of the devices to the other of the devices, either contactlessly or through contacting components, such as through the coupling of two light pipes or a light transmitter and receiver combination such as opto-isolator.

"Acoustic communication" as used herein is the coupling of two devices to supply sound, compression waves, or vibration from at least one of the devices to the other of the devices, either contactlessly or through contacting components.

"Thermal communication" as used herein is the coupling of two devices to supply heating or cooling through radiation, conduction, or convection from at least one of the devices to the other of the devices, either contactlessly or through contacting components.

The terms "provide" and "supply" and any variation thereof, are used herein to denote a source of the service relative to a device receiving the service. Neither term is limited to the original source of the service. A device that provides or supplies a service may simply be passing on the service from the original source, such as a residential power or water utility system or the internet. For example, a device that provides an electrical power service may pass on electricity it receives from a household outlet. However, the device may alternatively or additionally provide another eService that originates with the device, such as a data service.

The term "receive" and any variation thereof, is used herein to denote receipt of a service relative to the device providing the service. The term is not limited to the ultimate consumer of the service. A device that receives the service may simply be passing on the service from the source, such as an appliance, to a device that will consume, as hereinafter defined, the service. The device which receives a service is not necessarily the end consumer of the service.

The term "consume" and any variation thereof, as used herein denotes the act of employing or dispensing at least a portion of the service received in connection with performing a function, such as using a power, illumination or acoustic service to operate a speaker or video display.

A "useful device" as used herein is a device that is capable of performing a useful physical or virtual function either alone or in combination with another device.

A "service consumer" as used herein is any useful device that employs, uses, stores, or dispenses a service in connection with performing a physical or virtual function. A service consumer may be, for example, a consumer electronic device, a remote user interface, a source of consumer information, a reader, such as a bar code, optical scanner or RFID reader, a sensor device, a smart utensil, a portable appliance, an additional smart coupling device, a remote controller, a network binder, a cycle accessory, a resource controller, such as an energy controller, a communicator, such as an audible accessory, an access or payment system, such as a smart card system permitting access to a host device, a sales demonstration device, an eService holder, such as a battery, a dispenser, a media content holder, a resource controller, such as a water controller, a dispenser, a filter, a water filter, an air filter, a detergent dispenser, a drink dispenser, a detergent cartridge, a substance holder, such as a bottle, a jug, or a cycle accessory.

An "eService consumer" as used herein is any service consumer that uses an eService, such as a device using an illumination service to provide or enhance visibility, or a device using a thermal service to change or maintain a temperature for a container or a substance.

A "service provider" as used herein is any device that is capable of providing or supplying a service to another device.

An "eService communicating device" as used herein is any device that is capable of communicating an eService with another device, and may be an eService provider or an eService consumer.

A "host" as used herein is a service provider, which has a primary function independent of providing an service. For example, the host may be an appliance and the primary function can be performing a series of steps to conduct a useful cycle of operation. The appliance may be a conventional household appliance, such as a refrigerator performing a cooling cycle or an ice making cycle. Other examples of appliances that may be hosts include, but are not limited to, a freezer, a conventional oven, a microwave oven, a dishwashing machine, a stove, a range, an air conditioner, a dehumidifier, a clothes washing machine, a clothes dryer, a clothes refreshing machine, and a non-aqueous washing apparatus, or any combination thereof. Alternatively, the host may be a fixture such as a water softener, a water heater, a furnace, pool water treatment equipment, or an HVAC system. The host may be a small device such as a thermostat, a blender, a mixer, a toaster, a coffee maker, a trash compactor, an air purifier, an iron, a vacuum cleaner, or a robot. The host can alternatively comprise a structural feature of a building, such as a wall, cabinet, or door. The host may be a service consumer in addition to being a service provider. For example, the host may provide an illumination service while receiving or while supplying and receiving a data service.

As used herein, the terms "accessory" or "accessory device" refer to any useful device that may be used primarily in conjunction with a host to enhance, supplement, regulate or monitor the functionality of the host. An accessory device may be a service provider, a service consumer, or both. Examples of an accessory device include, but are not limited to, a television, a video camera, a video recorder, a personal computer, a notebook computer, a computer monitor, a video display, a keyboard, a printer, copying equipment, a calculator, a facsimile machine, a scanner, a digital storage device, a wireless transceiver, an internet router, a power supply, a data recorder, an answering machine, a telephone, a cordless telephone, a cellular telephone, a video game system, a personal digital assistant, a DVD player, a VHS player, a VCR, a cassette deck, an 8 mm video player, a CD player, a Blackberry®, a smartphone, a smoke detector, a portable digital video player, an MP3 player, a radio, other music players, an audio speaker, a digital picture frame, a weather station, and a scale or balance.

A "portable device" as used herein is a useful device that is designed to be moveable by a user during its useful life between a use location and a storage location or alternative use location. A portable device can be an accessory device.

An "independent device" as used herein is a useful device that provides a useful function without being connected to a service provider. In some cases, the primary function of the independent device is different from the primary function of the host from which the independent device may receive a service. The independent device may be a consumer electronic device, such as portable communication, entertainment, informational or educational devices.

A "dependent device" as used herein is a useful device that provides a useful function only when connected to a service provider. A dependent device may be a service consumer. Examples of dependent service consumers that may be coupled to a host include a remote user interface (UI), a consumable reader, a cooking sensor, a smart pan or pot, a smart dimmer, a cycle accessory, an energy controller, an audible accessory, a laundry payment or smart card system, a sales demonstration unit, or a service laptop or other service client.

A "service connector system" as used herein is a connector system having at least two separate service connector components, each associated with a useful device. The service connector components cooperate with one another to couple the useful devices to facilitate communication of a service between the useful devices. A service connector system that facilitates communication of an eService between useful devices may alternately be referred to as an "eService connector system". A service connector system may carry multiple services, including multiple eServices or an eService and another service, such as power or substance.

A "switched service connector system" as used herein is a service connector system having a switching capability in at least one of the service connector components operable to selectively permit the communication of a service between the components of the service connector system. If the service connector system is an eService connector system, the switched service connector system may alternately be referred to as a "switched eService connector system".

A "service switch" as used herein is any component used to selectively permit the communication of a service between components of a service connector system. A service switch may be associated with more than one type of service. For example, an electromagnetic service switch may be associated with, integrated with, or comprise a service switch or may be independent of a service switch. A service switch that permits communication of an eService may alternately be referred to as an "eService service switch".

A "plug" as used herein is a generally male service connection component.

A "receptacle" as used herein is a generally female service connection component.

A "service line" or "service pathway" as used herein is a line or pathway for transferring a service from one location to another. The service line may have any of a variety of configurations, including, but not limited to, a pipe, a conduit, a wire, a tube, a channel, and a fiber optic cable.

An "eService line" or "eService pathway" as used herein is a service line or pathway for transferring an eService from one location to another. The eService line may have any of a variety of configurations, including, but not limited to, a pipe, a conduit, a wire, a tube, a channel, and a fiber optic cable. For example, for thermal service communication, a service line may include a tube, a passageway, or a conductive path such as metal bar or heat pipe, or may include a radiation heat source and a radiation heat absorber. For illumination, an eService line may be a light pipe or a light sender and receiver. For acoustic service communication, an eService line may include a vibration conductive tube or wire, or may be a speaker and a microphone.

An "eService transmitter" as used herein is any device capable of receiving an eService from an eService provider and providing it to another device in the form of a wave.

An "eService receiver" as used herein is any device capable of receiving an eService in the form of a wave and consuming the eService or passing the eService to an eService consumer.

"Wireless" refers to a type of communication in which power and/or data is transferred over a distance without the use of electrical conductors or wires. For example, electromagnetic waves, light waves, or acoustic waves can be used to carry power and/or data over a distance without using electrical conductors or wires.

A "proximity target" as used herein is any component or device that may be detected when positioned within a predetermined distance of an associated proximity sensor, defined below. A proximity target may be passive, such as visual target or a magnetic target formed of magnetic or magnetic responsive material. Other examples of passive proximity targets may include a conductive component or surface capable of cooperating with a magnetic field, a current, or a voltage provided by a proximity sensor. A proximity target may alternatively be active or powered such as an electromagnet, a generator of a magnetic field, a current, a voltage or an acoustic wave. An active proximity target may alternatively provide a powered readable display or dispense a detectable chemical.

A "proximity sensor" as used herein is any component or device that may detect an associated proximity target when the proximity target is within a predetermined distance of the proximity sensor. A proximity sensor may detect, for example, a change in an electromagnetic field, an electromagnetic wave, an acoustic wave, a visual target a chemical component, an electrical signal, a change in voltage, a change in current, a change in frequency, a change in resistance, a change in inductance, a change in capacitance, a mechanical signal, a change in pressure, a displacement, a vibration, and the presence of a chemical, A proximity sensor may be active or passive, such as a magnetic sensor of magnetic or magnet responsive material, or may alternatively be active. Examples of active sensors include active magnetic sensors, light sensors, optical sensors, acoustic sensors, electromagnetic sensors, chemical sensors and thermal sensors. Examples of magnetic sensors include magnets and magnetic responsive components. Examples of optical sensors include infrared sensors, photoelectric sensors, fiber optic sensors, photo resistors, photovoltaic sensors, photo diodes and cameras. Examples of electromagnetic sensors include radio receivers, radar sensors, Hall Effect sensors, inductive sensors, capacitive sensors, variable reluctance sensors and eddy current sensors. Examples of acoustic sensors include ultrasonic sensors and microphones. A contact proximity sensor detects a proximity target by touching the proximity target. A contactless proximity sensor detects the proximity target through a wireless or contactless means. For example, magnetic flux can be used as the signaling mechanism between a contactless proximity sensor and a contactless proximity target.

As used herein, the term "proximity system" is a system that uses a "proximity switch" operated by a plurality of "proximity coupling components," each associated with a different parent device, for determining that the parent devices are in proximity with each other. Parent devices are usually paired, examples of which include a service provide and a service consumer, a host and an accessory, and a host and an adapter. Proximity coupling components may include a proximity target associated with one parent device to actively or passively provide an indication of the presence of the one parent device, and a proximity sensor associated with the other parent device that is responsive to the presence of the proximity target to activate the proximity switch. The proximity switch may be used to provide a signal or message indicative of the proximity of two parent devices, or may directly or indirectly regulate the flow of a service along a service line. The proximity systems disclosed herein employ contact proximity systems, wherein the proximity target and proximity switch use physical contact to detect the proximity of the two parent devices.

An "adapter" as used herein is an intermediate device that may be provided between a first and second useful device, such as between a host and an accessory, to facilitate the communication of services between the first and second useful devices. An adapter may receive a service from the first useful device and provide a modified version of the service to the second useful device, for example, by providing an electrical power service using a different voltage or providing a data service using a different data structure or signal type. In some applications, multiple adapters may be interposed between two accessory devices. In other applications, three or more devices may be coupled to a single adapter, such as between a host and two accessories. In some applications, the adapter may itself be an accessory device providing a useful function not provided by the accessory devices coupled to it. An adapter may optionally include a transformative component that transforms a service from a service provider to a different service, which is supplied to a service consumer. This may be useful when the service from the service provider is not compatible with the service consumer. The transformative component can be configured to transform the service into a compatible form for the service consumer. Examples of transformative components are protocol converters, power transformers, or other devices that convert substance, energy, or data from a first form to a second form.

A "functional unit" as used herein is any adapter coupled to a useful device, which together provide functionality that neither the adapter nor the useful device can alone provide. Any functional unit itself is also included within the meaning of the term "useful device". In some cases, it is contemplated that a dependent device may be coupled with an adapter that provides one or more eServices required by the dependent device to enable the functional unit to provide a useful function, in which case the functional unit also constitutes an independent device.

A "storage device" as used herein is any device capable of receiving an eService, storing the eService, and selectively dispensing the eService. A storage device may include, for example, a battery, a capacitor, a hard disk drive, an optical disc, such as CD, DVD, or Blue-ray Discs, a floppy disk, a ZIP disk, a minidisk, a solid state semiconductor memory, such as xD-Picture card, a MultiMediaCard, a USB flash drive, SmartMedia, an SD card, a miniSD card, an SDHC card, a microSD card, a TransFlash card, a CompactFlash I or II, a Secure Digital, or a Sony Memory Stick.

A "conversion device" as used herein is any device capable of converting the form of an eService or converting one eService to another eService. Examples of a conversion device include, but are not limited to, a generator, a motor, a piezoelectric device, a pneumatic device, an inverter, a lens, a filter, a prism, a transmitter, a speaker, and a resonator.

As used herein, a "substance" is a material that may be communicated from one device to another. A substance may include a gas, a liquid, or a solid, or any combination thereof. Examples of substances include, but are not limited to, liquid soap, powdered soap, compressed air, tablets, caplets, water, ice cubes, and a beverage.

As used herein, "substance communication" or a "substance communication service" is a useful provision of a substance from one device to another device. Communicating a substance includes supplying or receiving a substance. As used herein, communication of substance includes both uni-directional and multi-directional communication between any two devices, either directly or through an adapter, as defined herein. Substance communication may be provided in quanta, such as capsules or other doses of substances, batches of discrete items, such as tablets, or consumable components.

The term "consumable" and any variation thereof, as used herein, includes any substance that may be consumed by a host, an accessory device, or a user person, such as food, cosmetics, or medicine. The consumable may, for example, be a substance that is used up and must be replenished for subsequent cycles of operation. For a clothes washer, a consumable might be a detergent and/or a softener. For a clothes dryer, a consumable might be an anti-static cloth. For a cooking or refrigeration appliance, the consumable may actually be the article on which the appliance performs its cycle of operation, as in the case of food, later to be consumed by a person. More specific examples of the use of a consumable in appliances include dispensing additives for clothes washers, clothes dryers, or combination washer/dryer appliances. The additives may include, but are not limited to, normal detergents, gentle detergents, dark clothing detergents, cold water detergents, fabric softeners, chlorine bleaches, color-safe bleaches, and fabric enhancement chemistry. Non-limiting examples of fabric enhancers are additives to provide stain resistance, wrinkle resistance, water repellency, insect repellency, color fastness, fragrances, and anti-microbials. Another example of a consumable are the filters used by an appliance. Refrigerators, dryers, washers, and dishwashers are all known to use filters that are consumed in the sense that they wear out and must be replaced.

The term "substance consumer" and any variation thereof, as used herein, is any useful device that employs, uses, stores, or dispenses a substance in connection with performing a physical or virtual function. A substance consumer may be, for example, a smart utensil, an appliance, a resource controller, such as a water controller, a dispenser, a filter, a water filter, an air filter, a detergent dispenser, a drink dispenser, a detergent cartridge, a substance holder, such as a bottle, a jug, or a cycle accessory.

The term "substance provider" and any variation thereof, as used herein, is any device that is capable of providing or supplying a substance to another device.

As used herein, the term "substance holder" is anything that holds or contains a substance, which may include, but is not limited to, a container, a dispenser, a cartridge, a dish, a bag, or a carton.

As used herein, the term "consumable holder" is any substance holder that holds or contains a consumable.

Figures 2, 3:
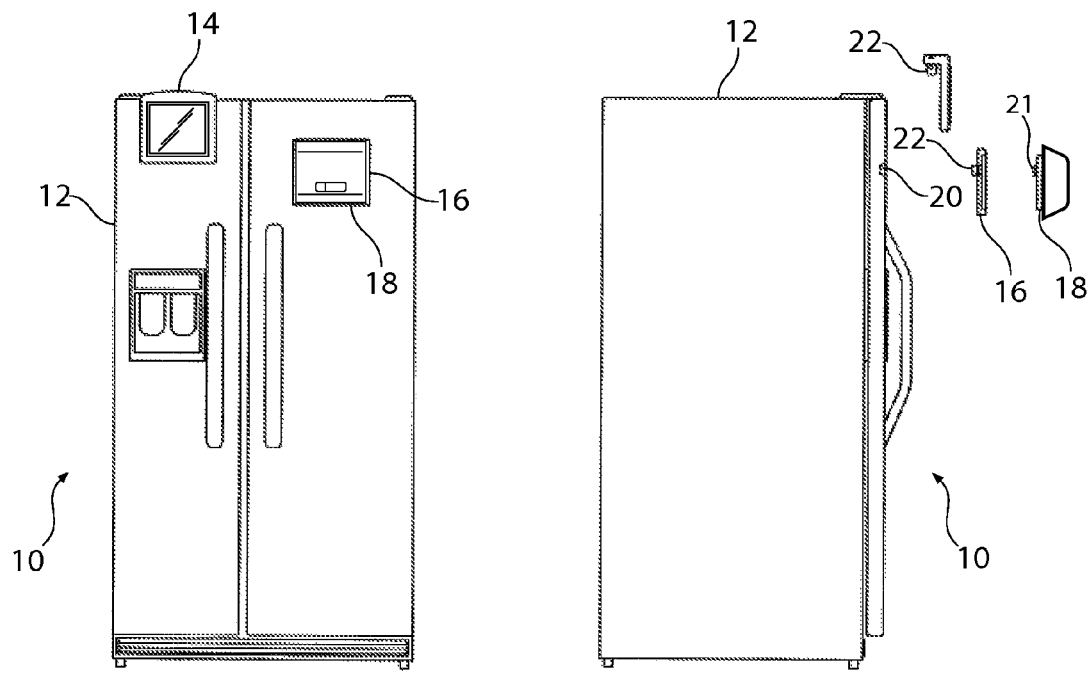
FIG. 2 is a front elevational view of the modular system of FIG. 1 showing the accessory device attached to the host.
FIG. 3 is a side elevational view of the modular system of FIG. 1 showing the accessory device removed from the host.

Referring now to FIGS. 1-3, a schematic illustration of a modular system 10 according to one embodiment of the invention is shown to include at least one host 12 and at least one accessory device 14 that can be coupled to host 12.

The accessory device 14 may be either directly or indirectly coupled to host 12. Direct coupling occurs when accessory device 14 includes an eService connector component suitably configured for engaging a corresponding eService connector component of host 12 to establish an eService pathway between the host 12 and the accessory device 14. The eService pathway provides a eService line for transferring at least one eService from host 12 to accessory device 14 and from accessory device 14 to host 12.

An adapter 16 can be provided for coupling a second accessory device 18 having an incompatible eService connector component to host 12. An eService connector component is incompatible if it cannot be directly coupled to a corresponding eService connector component, such as when the incompatible eService connector component lacks certain physical features that would enable the eService connector component to engage the corresponding connector component to establish an eService pathway. Adapter 16 may include an eService connector component that can be directly coupled with the eService connector component of host 12 and a second eService connector component that can be directly coupled with the incompatible eService connector component of accessory device 18, thereby establishing an eService pathway between host 12 and accessory device 18.

Although accessory device 14 is shown coupled to an upper surface of host 12, whereas accessory device 18 is shown attached to a front surface of host 12 by way of adapter 16, it shall be appreciated that in practice, accessory device 14 and adapter 16 may be suitably configured for coupling to host 12 in any desired location and manner in order to accommodate the design and performance requirements of a particular application.

Host 12 may perform a primary function. As illustrated herein, host 12 is a refrigerator performing a cooling cycle and/or an ice making cycle. Although the figures show an appliance comprising a refrigerator, it shall be understood that the invention is not limited to refrigerators or appliances in general.

Accessory devices 14 and 18 may also perform at least one primary function. The primary function of accessory devices 14 and 18 will likely be different from the primary function performed by host 12, although it need not be. In the embodiment illustrated in the drawing, accessory device 18 may, for example, be a display selectively illuminated by an illumination service provided by host 12 or having a speaker selectively activated by an acoustical service provided by host 12 to provide information to a user. Alternatively, for example, accessory device 18 may be a substance holder, such as a dispenser, which contains a substance that is selectively heated by a thermal service provided by host 12.

Host 12 can be configured to provide or receive at least one eService to or from accessory devices 14 and 18. Similarly, accessory devices 14 and 18 may also be configured to provide or receive at least one eService to or from host 12. It is not necessary that the eService transferred between host 12 and accessory devices 14 and 18 be used in performing the primary function of host 12 or accessory devices 14 and 18, or otherwise be related to the primary function of either device.

As mentioned previously, in instances where the accessory device includes an incompatible eService connector component that prevents direct coupling of the accessory device to host 12, adapter 16 may be provided for indirectly coupling the accessory device to host 12. Adapter 16 operates to establish an eService pathway for transferring the desired eService between host 12 and accessory device 18 having the incompatible eService connector component. Adapter 16 may alternatively communicate a first type of service with host 12 and a second type of service with accessory device 18. For example, adapter 16 may receive electrical power service from host 12 and use that to create illumination service for accessory device 18 or receive electrical and thermal service from host 12 and use that to provide a substance service to accessory device 18.

Accessory devices 14 and 18 and host 12 may each be eService communicating devices. At least one eService can be supplied to accessory devices 14 and 18 from host 12, or from accessory devices 14 and 18 to host 12. The supply of the eService can be uni-directional in that either host 12 supplies the eService to accessory devices 14 and 18 or accessory devices 14 and 18 supply the eService to host 12. The supply of the eService may alternatively be bi-directional in that the supplied eService can be delivered from host 12 to accessory devices 14 and 18 and from accessory devices 14 and 18 to host 12.

Host 12 and accessory device 14 may each be associated with at least one eService connector component, respectively referred to herein as a host eService connector component 20 and a device eService connector component 22. In the exemplary embodiment illustrated, host 12 comprises an eService provider and accessory device 14 comprises a portable eService consumer that functions as an accessory to host 12.

Host eService connector component 20 and device eService connector component 22 have complementary configurations that enable the eService connector components to be coupled to one another, thereby establishing an eService pathway over which desired eServices can be transferred between host 12 and accessory device 14. In instances where the accessory device includes an incompatible eService connector component, device eService connector component 22 may be included in an adapter, such as adapter 16. As illustrated, the adapter 16 has a first device eService connector component 23 for engagement with a device eService connector component 21 of the accessory device 18, as well as a second device eService connector component 22 for connection with a second host eService connector component 20 of the host 12. As a consequence, device eService connector components 22 may have the same general configuration whether included as part of accessory device 14 or adapter 16, and host eService connector component 20 may have the same general configuration whether it couples directly with an accessory device or an adapter. Accordingly, for purposes of discussion, the various features and operation of eService connector components 20 and 22 will hereinafter be described in connection with accessory device 14, but it shall be appreciated that device eService connector components 20 and 22 may also be used in conjunction with adapter 16.

Figure 4:
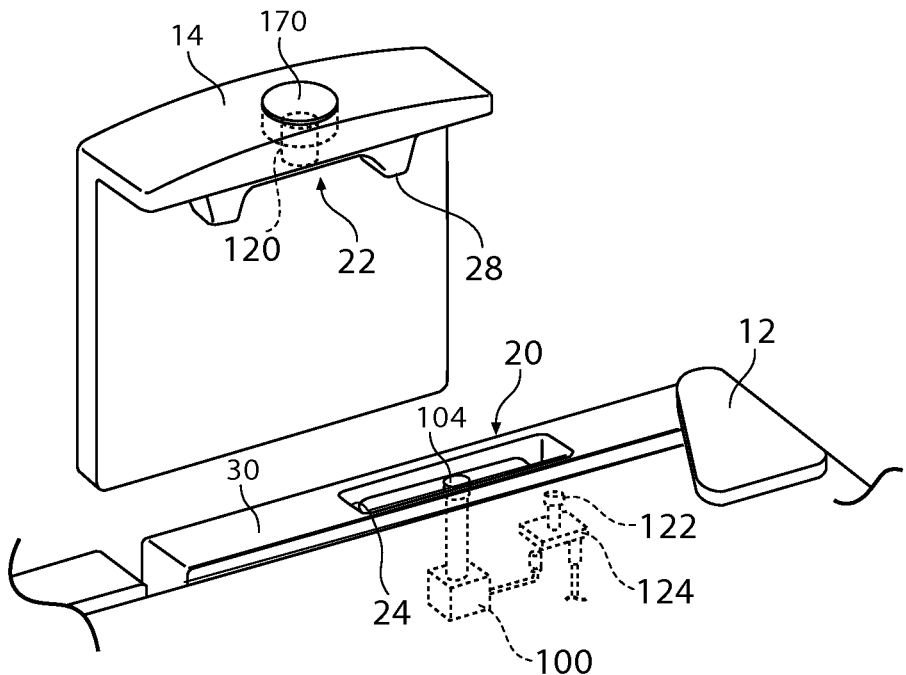
FIG. 4 is a partial top rear perspective view of the modular system of FIG. 1 with the accessory device removed from the host, showing a host portion of the mechanically energized eService connector system, with portions shown schematically.
Figure 5:
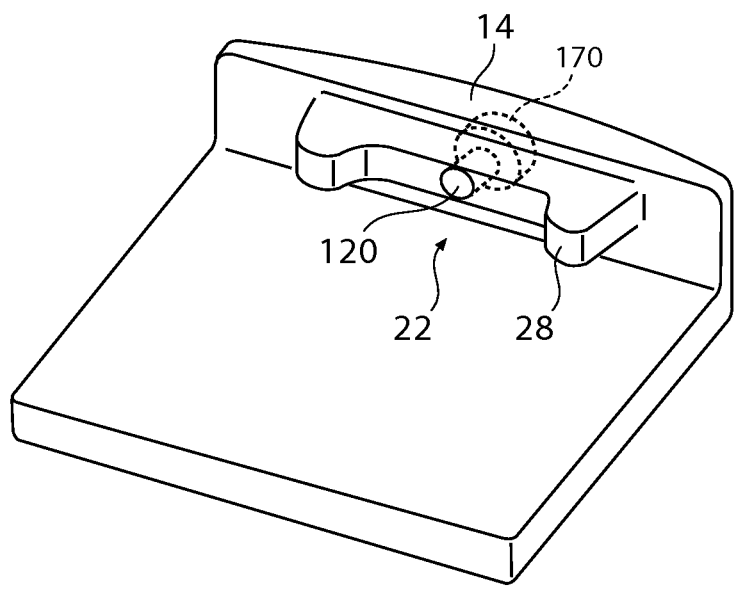
FIG. 5 is a bottom perspective view of the accessory device of FIG. 1 showing an accessory device portion of the mechanically energized eService connector system.

Referring to FIGS. 4 and 5, the host eService connector component 20 may be provided with a first eService connection component, such as a receptacle comprising a recess 24, proportioned to accept a second eService connection component, such as a plug comprising a pair of ridges 28 engageable with recess 24 to facilitate alignment of the eService connector components. It will be appreciated that ridges 28 are merely one example of the type of features that may be incorporated into host eService connector component 20 and device eService connector component 22 to aide alignment and coupling of accessory device 14 to host 12 and that host eService connector component 20 and device eService connector component 22 may include various features to facilitate coupling of accessory device 14 to host 12. In practice, other configurations may also be employed to accommodate various design considerations of a particular application.

Host eService connector component 20 can be integrally formed with host 12 or may be an add-on device. For purposes of discussion, host eService connector component 20 is shown integrally formed with host 12. When configured as an add-on device, host eService connector component 20 may also function as an adapter to enable a host and an accessory device having dissimilar eService connector components to be indirectly coupled to one another. Host eService connector component 20 may be removable or non-removable from host 12. Host eService connector component 20 can be configured to transfer or receive a single eService or multiple services.

Device eService connector component 22 may be integrally formed with accessory device 14 or may be an add-on component. For purposes of discussion, device eService connector component 22 is shown integrally formed with accessory device 14. When configured as an add-on component, device eService connector component 22 may also function as an adapter to enable a host and an accessory device having dissimilar eService connector components to be indirectly coupled to one another. Device eService connector component 22 may be removable or non-removable from accessory device 14. Similarly, device eService connector component 22 can be configured to transfer or receive a single eService or multiple services.

Figure 6:
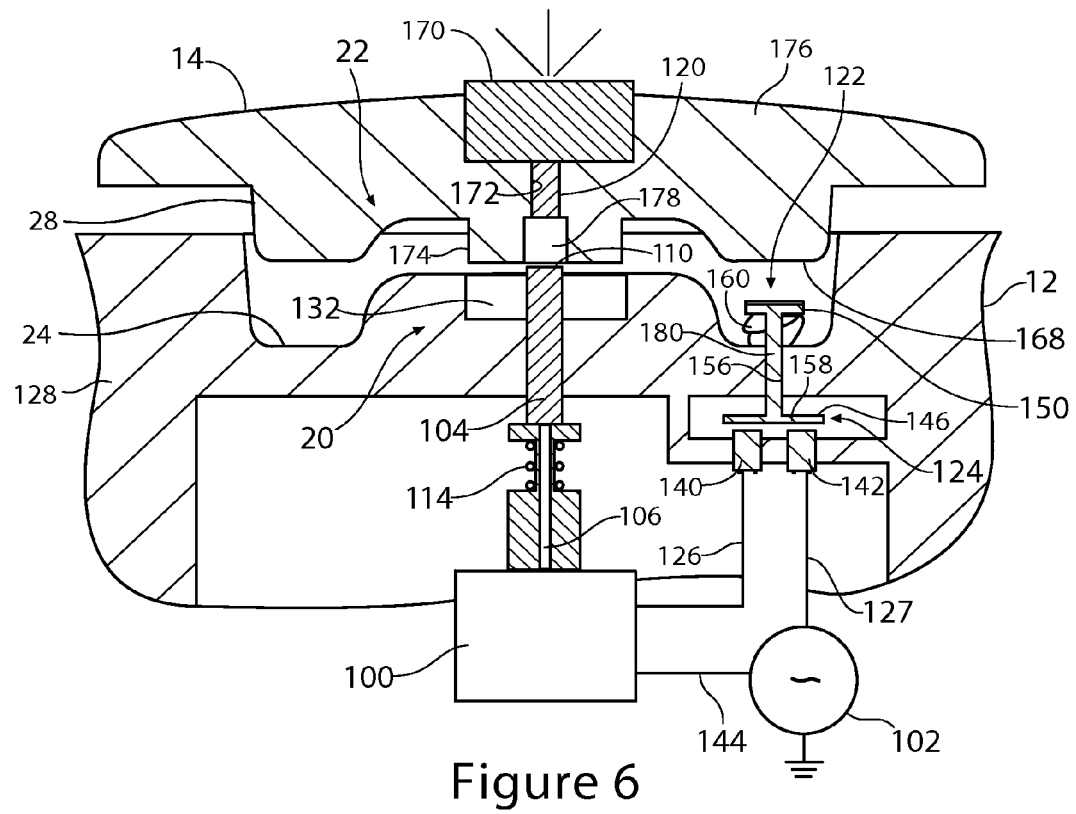
FIG. 6 is a partial cross-sectional view of the mechanically energized eService connector system of FIG. 1 showing the accessory device portion of the eService connector system positioned for engagement with the host portion of the eService connector system.
Figure 7:
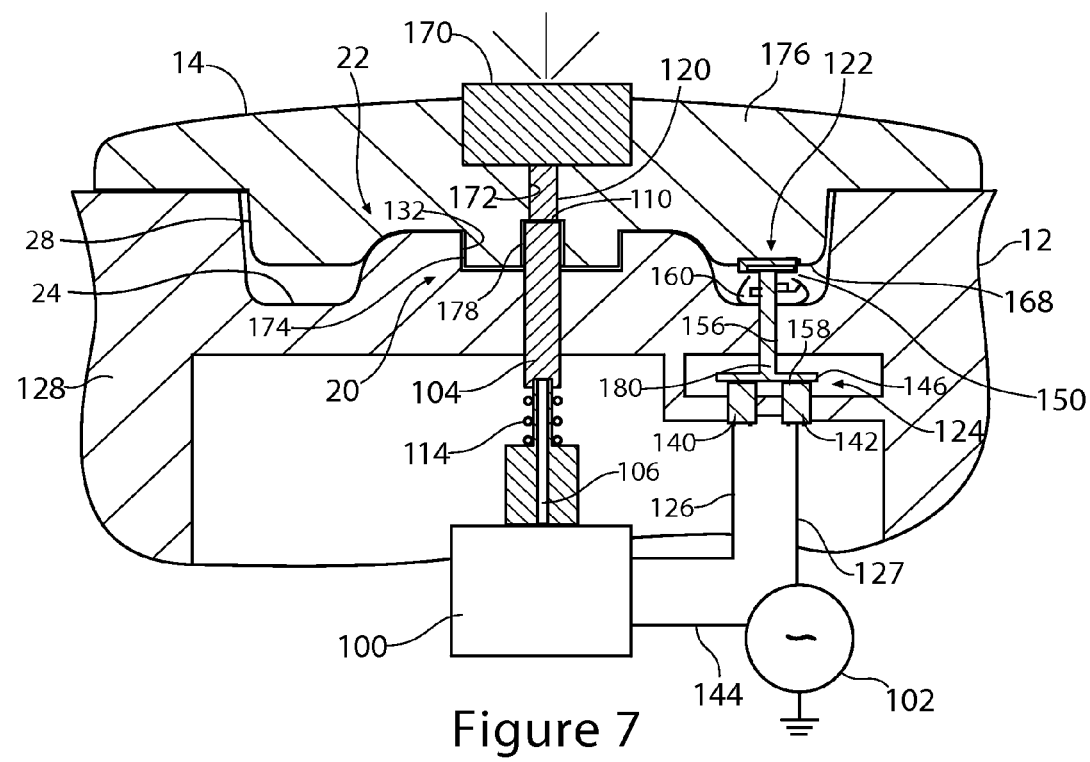
FIG. 7 is a partial cross-sectional view similar to FIG. 6 showing the accessory device portion of the exemplary eService connector system engaged with the host portion of the eService connector system.

Referring to FIGS. 6 and 7 generally, host 12 may be associated with an eService provider 100 for selectively providing an eService to host eService connector component 20 for delivery to device eService connector component 22. Accessory device 14 may similarly be provided with a eService consumer 170 capable of using the eService delivered to device eService connector component 22.

The eService provider 100 illustrated in the drawing is powered by an electrical power supply 102 and uses the electrical power to create a first service. It will be appreciated that the power supply 102 or eService provider 100 may be integrated into host 12 or provided in other devices in communication with host 12. The first service is supplied by eService provider 100 to an eService transmitter 104 by way of a service line 106.

EService provider 100 may be any type of eService provider and the first service may be any eService directly transmitted by eService transmitter 104. For example, service provider 100 may be a thermal service provider 200 (see FIG. 8), and service line 106 and eService transmitter 104 may be heat conductive rods or wires. Service provider 100 may alternatively be an acoustic service provider 300 (see FIG. 9), and service line 106 and eService transmitter 104 may be sound conductive rods or wires. Service provider 100 may alternatively be an illumination service provider 400 (see FIG. 10), and service line 106 and eService transmitter 104 may be a light pipe. These eService providers 200, 300, and 400 will be described later herein.

With continued reference to FIGS. 6 and 7, it will be appreciated that, in addition to a eService provider 100 being a potential provider of sound, illumination, or heat, eService provider 100 may be a source of data, such as a source of fiber optic data, and a switch, such as a fiber optic switch for enabling the exchange of the fiber optic data between two eService communication devices.

It will further be appreciated that service line 106 or eService transmitter 104 may comprise a portion of the eService provider 100 by, for example, incorporating cal-rods, LEDs, sound generators, image generators, hologram generators, or other wave generating or transmitting features governed by eService provider 100. In the case of a sound generator, eService provider 100 may be a source of acoustic information using DTMF tones or Morse code for transmission, thereby creating an acoustic data network when a service switch 124, described later herein, is actuated. In the case of an image generator, eService provider 100 may project an image, such as a "smiley face" image. In this case, eService transmitter 104 might be a translucent film, which has the smiley face image encoded on it such that when service switch 124 is actuated, eService provider 100 supplies light through the eService transmitter 104 thereby causing the image to be projected to an eService communication device such as accessory device 14.

Alternatively, eService provider 100 may be a different type of service provider, such as an AC to DC converter, providing a first service to eService transmitter 104. In this instance, eService transmitter 104 may function as both an eService provider and as an eService transmitter by using the first service, such as direct current electrical power, to create an eService, such as by heating a heat conducting wire, generating light and sending it into a light pipe, or generating an acoustical wave and sending it along a vibration conducting rod.

EService transmitter 104 has an exposed end 110 extended through a bore in a housing 128 of host 12 and into an enlarged counter bore 132 formed in the outwardly facing portion of housing 128. Enlarged counter bore 132 acts as a receptacle for a plug associated with accessory device 14, as will be described below. Where appropriate and practical for the type of service line 106, service line 106 may have a sliding engagement with eService transmitter 104 or with service provider 100, or may be flexible to permit some relative movement between eService transmitter 104 and eService provider 100. A biasing means, such as a spring 114, may be provided to bias eService transmitter 104 away from eService provider 100 to facilitate proper engagement of eService transmitter 104 with an eService receiver 120 when the eService connector components 22 and 20 are engaged.

Host 12 may also be provided with a switched service connector system employing a proximity switch 122 for remotely controlling the operation of a service switch 124. Service switch 124 selectively controls the transfer of the first service from eService provider 100. Service switch 124 may have any of a variety of configurations depending on the type of first service provided by eService provider 100 or the type of eService being transmitted by eService transmitter 104. For example, if the first service is mechanical or electrical power, service switch 124 may be configured as a mechanical or electronically controlled switch.

As illustrated, service switch 124 may control the operation of eService provider 100 by selectively closing, which completes a circuit with power supply 102 and service provider 100 by way of service lines 126 and 127 connected between contacts 140 and 142 of service switch 124 and service provider 100 and power supply 102, as well as by way of service line 144 connecting power supply 102 with eService provider 100. Alternatively, service switch 124 may directly control the operation of power supply 102 by way of direct power or data lines (not shown) between service switch 124 and power supply 102, and eService provider 100 may be separately connected to power supply 102 so as to receive power only when power supply 102 is activated. Similarly, service switch 124 may directly control the operation of a control system, (not shown) of eService provider 100 by way of direct power or data lines between service switch 124 and the control system of eService provider 100. In the later instance, eService provider 100 may be operable to provide some service when service switch 124 is off and a different or additional service when service switch 124 is on. For example, eService provider 100 may provide a low intensity illumination service at a first frequency when service switch 124 is open and a higher intensity, varying frequency illumination when service switch 124 is closed.

Proximity switch 122 includes a link to a switch plate 146 selectively engageable with contacts 140 and 142 of service switch 124 to close service switch 124. As illustrated herein, the link comprises proximity sensor 150 and a moveable plunger 180. It will be appreciated that proximity sensor 150 may have any of a variety of configurations depending on the requirements of the particular application. In the embodiment shown in FIGS. 6 and 7, proximity sensor 150 is attached to the moveable plunger 180, which slidably engages an aperture 156 in housing 128 of host 12. One end of plunger 158 is operably connected to switch plate 146 and an opposite end extends out from housing 128 and is operably connected to proximity sensor 150. Proximity sensor 150 is engagable with proximity target 168, described below associated with accessory device 14.

Service switch 124 may be closed by the action of a proximity target upon proximity sensor 150, which will cause movement of the proximity sensor 150 and thereby plunger 180. Depressing plunger 180 causes switch plate 146 to be displaced toward and into engagement with contacts 140 and 142, thereby allowing a current to pass from service line 126 to service line 127. A biasing member 160 may be provided to urge plunger 180 and switch plate 146 away from contacts 140 and 142 when the proximity target 168 is not detected by proximity sensor 150.

As mentioned above, accessory device 14 has an eService consumer 170 and an eService receiver 120. EService receiver 120 is shown schematically in FIGS. 6 and 7 as a rod-like structure coupled directly to eService consumer 170 that directly uses the eService. EService consumer 170 may be any type of service consumer and the first service may be any eService directly transmitted by eService transmitter 104.

For example, if eService receiver 120 receives an illumination service, eService receiver 120 may be a light pipe and eService consumer 170 may be a light conductive device illuminated by the receipt of the illumination service from eService receiver 120 to provide an illuminated display for a user. If eService receiver 120 receives an acoustic service, eService consumer 170 may be a speaker amplifying and re-broadcasting sound to a user. If the eService receiver 120 is a thermal service receiver, eService consumer 170 may be a heat conductive surface or a heat conductive wire directing the thermal service, for example, to the contents of a bottle or a storage compartment.

It should be noted that the generically illustrated configuration is not intended to depict any particular configuration, but rather schematically represents a variety of potentially different configurations. In practice, the actual configuration will likely vary depending on, at least in part, the type of eService being transferred, space and power requirements, and manufacturing considerations. For example, acoustical transmission may require more contact surface area at coupling points such as between eService transmitter 104 and eService receiver 120 at the ends of service line 106 and between eService receiver 120 and eService consumer 170.

It should also be noted that, while the embodiment shows eService consumer 170 directly coupled to eService receiver 120 and using the eService as received by eService receiver 120, other configurations are contemplated.

Alternatively, where appropriate, a service line (not shown) may be provided between eService receiver 120 and eService consumer 170. For some applications, a conversion device (not shown) may be provided between eService consumer 170 and eService receiver 120 converting the output of eService receiver 120 to a service that may be used by eService consumer 170. Alternatively, a conversion device may be incorporated into eService receiver 120 or eService consumer 170. For example, a converter may be provided to convert illumination containing data into an electromagnetic service carrying data. EService consumer 170 may consume the eService for an internal operation of accessory device 14 or may relay the eService or a converted service to a second accessory device, such as accessory device 18 (see FIGS. 1-3). In still another instance, eService consumer 170 may be a component of an accessory device 18, which is only coupled to eService receiver 120 when accessory device 18 removably coupled to accessory device 14.

EService receiver 120 extends through a bore 172 in a plug 174 formed on an external surface of a housing 176 of accessory device 14 and terminates in an exposed end 178 engageable with exposed end 110 of eService transmitter 104 for the selective communication of eService therebetween. EService transmitter 104 moves against spring 114 to take up any tolerance between eService transmitter 104 and eService receiver 120 and to bias exposed ends 110 and 174 into engagement. Plug 174 is proportioned to fit inside the receptacle formed by counter bore 132 in housing 128 of host 12 when accessory device 14 is coupled with host 12.

As mentioned above, accessory device 14 is provided with a proximity target 168 engageable with proximity switch 122 when accessory device 14 is coupled to host 12. As depicted, proximity target 168 may be an abutment extending from housing 176 engageable with plunger 180 when the components are assembled.

Coupling of accessory device 14 to host 12 can be easily accomplished. When accessory device 14 is coupled to host 12, ridge 28 enters recess 24, plug 174 enters counter bore 132, and eService transmitter 104 operably engages eService receiver 120, as shown in FIG. 7. The process of coupling accessory device 14 to host 12 further causes proximity target 168 to engage proximity sensor 122, closing proximity switch 122 and thereby powering eService provider 100 or providing a signal to eService provider 100 that a connection has been made to accessory device 14. Powering eService provider 100 or providing a control signal to eService provider 100 allows the eService to pass from service provider 100 to eService consumer 170. Decoupling accessory device 14 from host 12 disengages proximity switch 122 and interrupts the transmission of the control signal to service switch 124, thereby deactivating the service switch.

Figure 8:
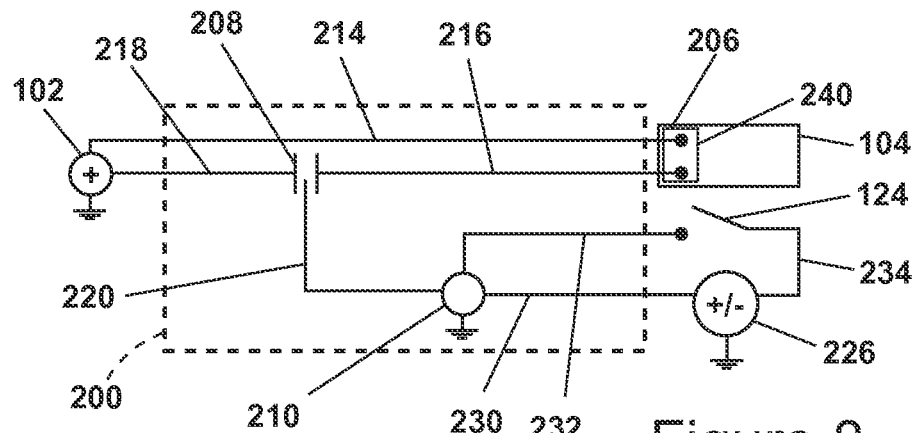
FIG. 8 schematically illustrates a thermal eService provider.
Figure 9:
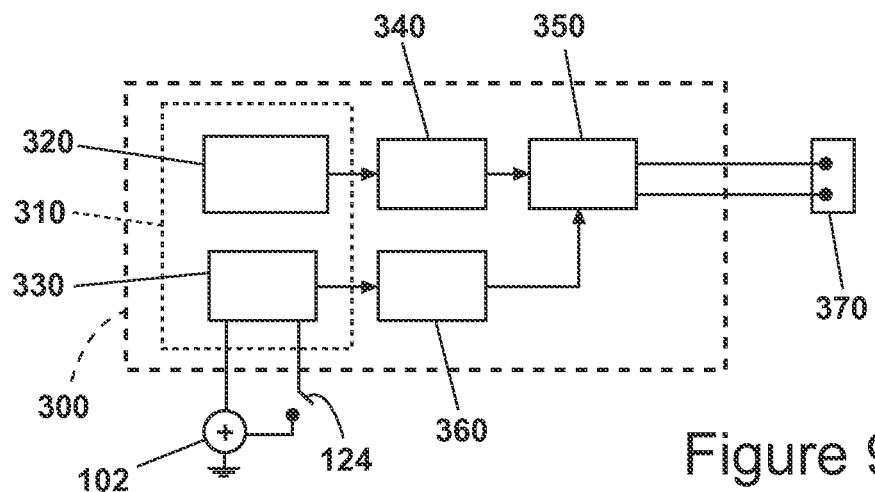
FIG. 9 schematically illustrates an acoustical eService provider.
Figure 10:
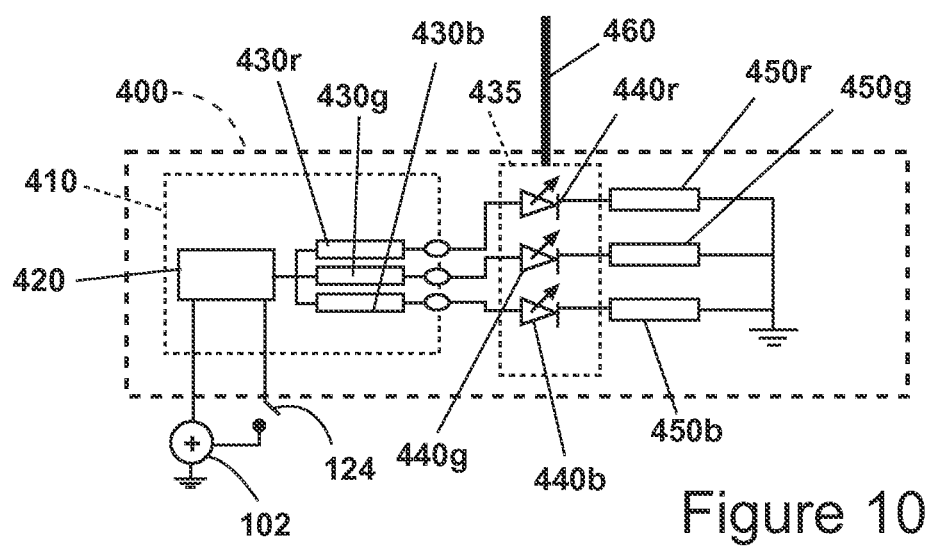
FIG. 10 schematically illustrates an illumination eService provider.

Referring now to FIGS. 8, 9, and 10, other embodiments of eService providers are illustrated schematically. FIG. 8 shows thermal service provider 200. FIG. 9 shows acoustic service provider 300, FIG. 10 shows illumination service provider 400.

As shown in FIG. 8, thermal service provider 200 may include a heat generator 206 and contacts 208 of a relay 210 for switching power to the heat generator connected in series with power supply 102. The heat generator 206 creates heat when current is passed through it. The heat generator 206 includes a heat conductive surface 240 capable of communicating heat to another device. Thus, heat generator 206 may be coupled with or may comprise a thermal eService transmitter 104, which may transmit thermal energy to a thermal eService receiver (not shown), such as thermal eService receiver 120 from FIGS. 6 and 7. The eService transmitter 104 may conduct heat when the current to heat transformer 206 generates heat. Heat generator is thermally coupled to eService transmitter 104 such that heat is transferred from heat generator 206 to eService transmitter 104 when contact 208 closes and power flows through the circuit shown in FIG. 8.

Power supply 102 is selected to have a high wattage output sufficient to enable heat generator 206 to generate a desired level of heat. More particularly, a first side of power supply 102 is connected by a power line 214 to a first side of heat generator 206, a second side of heat generator 206 is connected by a power line 216 to a first side of contacts 208, and a second side of contacts 208 is connected by a power line 218 to a second side of power supply 102.

Relay 210 is connected to contacts 208 by a mechanical coupling 220 operable to selectively complete the circuit between power supply 102 and heat generator 206. Relay 210 is connected in series with a low wattage power supply 226 and service switch 124, described previously with reference to FIGS. 6 and 7. More particularly, a first side of low wattage power supply 226 is connected by a power line 230 to a first side of relay 210, a second side of relay 210 is connected by a power line 232 to a first side of service switch 124 and a second side of service switch 124 is connected by a power line 234 to a second side of low wattage power supply 226. Thus, when service switch 124 is closed, as described above with reference to FIGS. 6 and 7, relay 210 is powered by low wattage power supply 226.

Mechanical coupling 220 may include a plunger (not shown), which moves according to the attractive magnetic forces created by the current flowing through the coil of relay 210. The plunger is mechanically coupled to high current contacts 208 with power lines 218 and 216 such that when the plunger moves in response to the current flow, the high current contacts are mechanically brought into electrical communication. Thus, relay 210 actuates to close contacts 208 to permit the flow of current to heat generator 206. It will be appreciated that there may be additional switches and logic regulating the supply of power from high wattage power supply 102 to heat generator 206, and contacts 208 may act as one of a plurality of switches that must be closed before heat generator 206 is powered.

As shown in FIG. 9, acoustic service provider 300 may include a microprocessor 310 having an input circuit connected with power supply 102 through service switch 124. When service switch 124 closes, the input of the microprocessor 310 changes state, thereby informing the logic of the microprocessor 310 that service switch 124 is closed.

Microprocessor 310 includes a sound source 320, which may be a sound generator or a sound processor connected to an external source of sound data in any digital or analog format. Microprocessor 310 further includes logic 330 for controlling the operation of the acoustical service provider 300. The output of sound source 320 is delivered, for example, through a digital-to-analog converter 340, which in turn delivers an electrical sound wave input to an amplifier 350.

Logic 330 is configured to respond to the information regarding the status of service switch 124 by enabling another digital-to-analog converter 360 to send a control analog signal to amplifier 350 which controls the level of the signal output of the amplifier, thereby effectively operating as an acoustic switch. Amplifier 350 receives the electrical sound input wave from sound source 320 and creates an amplified electrical sound output wave having an amplitude determined by the electrical sound input wave and the level of amplification indicated by the analog signal.

The sound output wave is then received by a speaker 370, which is coupled to the output of amplifier 350 and converts the output into a sound wave, which can be transmitted to an eService receiver, such as a microphone (not shown). Speaker 370 thereby serves as an eService transmitter.

As shown in FIG. 10, illumination service provider 400 may include a microprocessor 410 having an input circuit connected with power supply 102 through service switch 124. When service switch 124 closes, the input of microprocessor 410 changes state, thereby informing logic 420 of the microprocessor 410 that service switch 124 is closed. The logic 420 of microprocessor 410 is configured to respond to this information by allowing the logic 420 to determine the color and intensity of the light to be created by illumination service provider 400 in a manner described below.

Microprocessor 410 includes three pulse-width modulation (PWM) modules 430r, 430g and 430b, which can create PWM electrical signals. Each PWM module 430r, 430g, and 430b is associated with a particular output circuit of microprocessor 410. The output of each PWM module 430r, 430g and 430b is connected to one of three LEDs: red LED 440r, green LED 440g and blue LED 440b. The output of each LED 440r, 440g and 440b is combined and directed to a light pipe 460, which serves as an illumination eService transmitter. Each LED 440r, 440g and 440b is connected to ground through a resistor 450r, 450g and 450b.

The color transmitted from the light pipe 460 is determined by the relative proportions of the light each LED 440r, 440g and 440b generates. In particular, logic 420 controls each PWM module 430r, 430g and 430b such that each LED 440r, 440g and 440b receives a signal for a portion of time. Each LED 440r, 440g and 440b emits light at a magnitude proportional to the portion of time that the signal is received. A resultant color is created by the relative contribution of emitted light each LED 440r, 440g and 440b. Therefore, the resultant color output is controlled by the logic that controls the portion of time each PWM module 430r, 430g and 430b is sending the signal.

The intensity of the resultant color light transmitted from the LEDs 440r, 440g and 440b to light pipe 460 is also a proportional sum of the portions of time each PWM module 430r, 430g and 430b is sending the signal.

Therefore, the color and intensity of the resultant light provided to light pipe 460 may be controlled by logic 420 in response to the actuation of the service switch 124 by controlling the intensity of the light emitted by each of the LEDs relative to one another and the absolute intensity of the light emitted by all of the LEDs.

Figure 11:
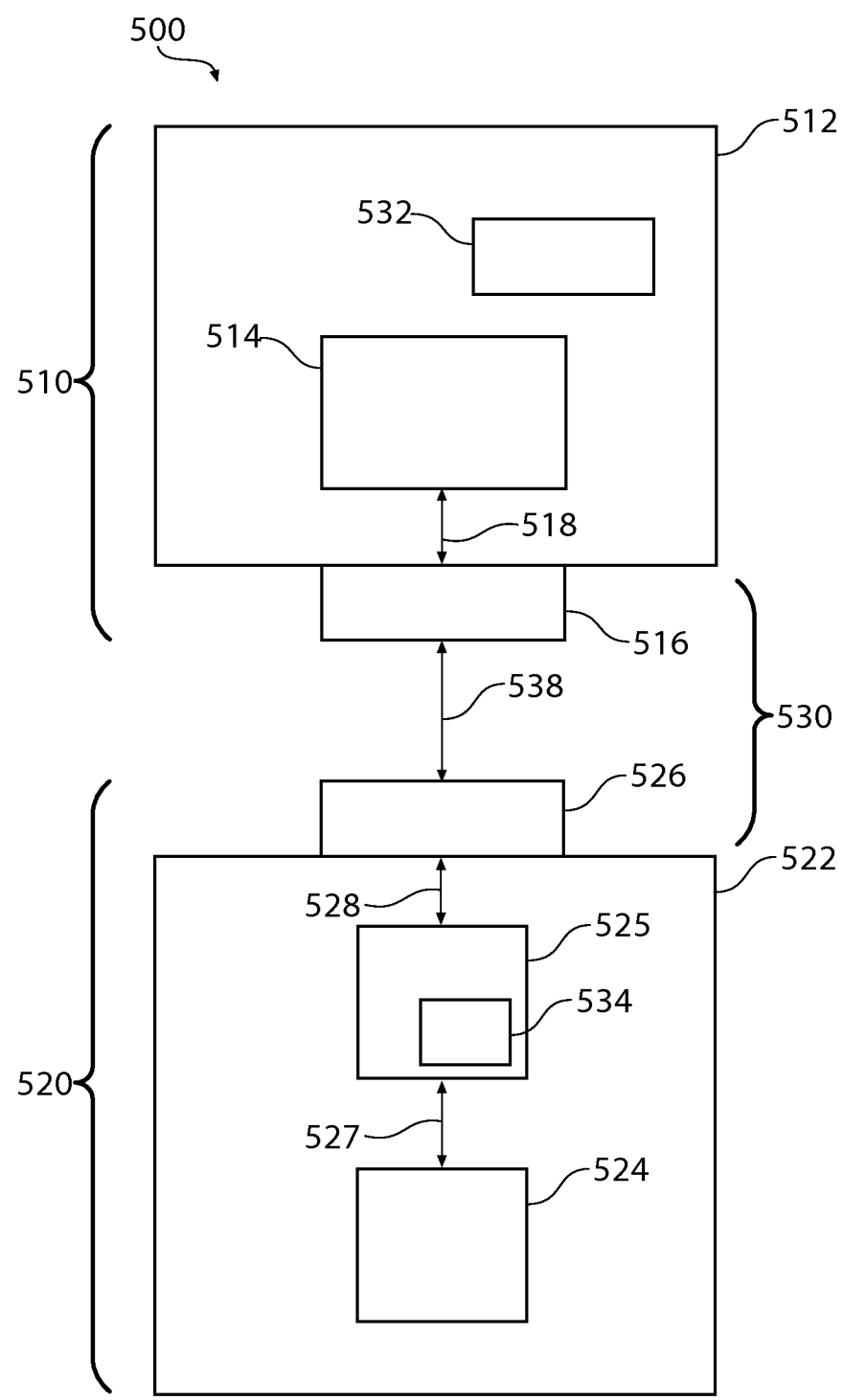
FIG. 11 schematically illustrates an eService provider and consumption system

With reference to FIG. 11, a more general example of an eService provider and consumption system 500 is schematically illustrated. A first subsystem 510 is connectable to a second subsystem 520 for selectively transferring an eService between subsystems 510 and 520. As illustrated, first subsystem 510 may include an accessory device 512, such as a portable device, a consumable holder, or a substance consumer, having an eService consumer 514 connected to a first eService connection component such as a plug 516 by means of an eService line 518. Second subsystem 520 may include a host 522, such as an appliance or a substance provider, having an eService provider 524 connected to a second eService connection component such as a receptacle 526 through a service switch 525 by eService lines 527 and 528.

A connector system 530 includes plug 516 and receptacle 526, which are selectively interengageable. A proximity target 532 and a proximity switch 534, which includes a proximity sensor for detecting the presence of proximity target 532, are respectively associated with first subsystem 510 and second subsystem 520, respectively. Proximity switch 534 is operable to selectively activate service switch 525 when plug 516 and receptacle 526 are engaged, as determined by the proximity sensor, to permit the flow of the eService from eService provider 524 to the receptacle 526, which may then be subsequently transferred along eService line 518 to eService consumer 514.

It will be appreciated that while host 522 is illustrated as including eService provider 524 and accessory device 512 is illustrated as including eService consumer 514, accessory device 512 may alternatively or additionally include an eService provider and host 522 may alternatively or additionally include an eService consumer. The components described are for illustrative purposes and, for many applications, any eService communicating device may be used for accessory device 512 and host 522. It will further be appreciated that while plug 516 is illustrated as being associated with eService consumer 514 and receptacle 526 is illustrated as being associated with eService provider 524, it is contemplated that plug 516 and receptacle 526 may be male or female connector components so long as the components are capable of interengaging to permit the transfer of eService therebetween.

With regard to the processes, systems, methods, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claimed invention.

It is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In summary, it should be understood that the invention is capable of modification and variation and is limited only by the following claims.

All defined terms used in the claims are intended to be given their broadest reasonable constructions consistent with the definitions provided herein. All undefined terms used in the claims are intended to be given their broadest reasonable constructions consistent with their ordinary meanings as understood by those skilled in the art unless an explicit indication to the contrary in made herein. In particular, use of the singular articles such as "a," "the," "said," etc. should be read to recite one or more of the indicated elements unless a claim recites an explicit limitation to the contrary.

What is claimed is:

1. An eService system for communicating an eService, comprising:
   a first eService communicating device comprising:
   an eService provider configured to supply an eService comprising a wave-based functionality excluding electrical power and electronic data;
   a first eService connecting component coupled with the eService provider; and
   a first proximity component comprising one of a proximity target or a proximity sensor configured to detect the proximity target by physical contact between the proximity sensor and the proximity target;
   a second eService communicating device comprising:
   an eService consumer configured to receive and use the eService;
   a second eService connecting component coupled with the eService consumer and configured to engage the first eService connecting component; and
   a second proximity component comprising the other of a proximity target or a proximity sensor configured to detect the proximity target by physical contact between the proximity sensor and the proximity target;
   a service switch operably coupled to the proximity sensor to selectively permit the communication of the eService between the first and second eService communicating devices, the service switch being actuatable by the proximity sensor in response to detection of the proximity target;
   wherein, when the first and second eService connecting components are brought into physical engagement, the proximity sensor detects the proximity target by physical contact and the eService is selectively supplied from the eService provider to the eService consumer via the engaged first and second eService connecting components in response to actuation of the service switch.

2. The eService system according to claim 1 wherein the service switch comprises an electro-magnetically operated switch.

3. The eService system according to claim 1, wherein at least one of the first and second eService communicating devices comprises one of:
   an appliance;
   an accessory device used primarily in conjunction with an appliance to enhance, supplement, regulate or monitor the functionality of the appliance;
   a consumable holder that holds a consumable that may be consumed by an appliance, an accessory device, or a person;
   a substance consumer that employs, uses, stores, or dispenses a substance in connection with performing a physical or virtual function; or
   a substance provider that is capable of providing or supplying a substance to another device;
   wherein the substance is a gas, a liquid, or solid material.

4. The eService system according to claim 1, wherein the wave-based functionality comprises one of an illumination service, an acoustic service, a thermal service, or an image service.

5. The eService system according to claim 1, wherein the eService consumer is at least one of an accessory device, a client software device, a remote user interface, a source of consumer of information, a reader, a sensor device, a smart utensil, a portable appliance, an additional smart coupling device, a remote controller, a network binder, a cycle accessory, a resource controller, a communicator, an access system, a payment system, a sales demonstration device, an eService holder, a dispenser, or a media content holder.

6. The eService system according to claim 1, further comprising a first eService line interconnecting the eService provider and the first eService connecting component for the transfer of the eService through the first eService line.

7. The eService system according to claim 6, further comprising a second eService line interconnecting the eService consumer and the second eService connecting component for the transfer of the eService through the second eService line.

8. The eService system according to claim 7, wherein the first and second eService lines each comprise at least one of: a conduit, a wire, a channel, a fiber optic cable, a metal bar, a heat pipe, a radiation heat source, a radiation heat absorber, a light pipe, a light sender, a light receiver, a vibration conductive tube, a speaker, or a microphone.

9. The eService system according to claim 7, further comprising a first housing, wherein the eService provider, the first eService line, and the first proximity component are each at least partially disposed within the first housing.

10. The eService system according to claim 9, further comprising a second housing, wherein the eService consumer, the second eService line, and the second proximity component are each at least partially disposed within the second housing.

11. The eService system according to claim 1, wherein the first eService communicating device further comprises an eService transmitter coupled with the eService provider for receiving the eService and providing it to the second eService communicating device in the form of a wave.

12. The eService system according to claim 11, wherein the eService provider is a thermal service provider and the eService transmitter comprises a heat conductive rod or wire.

13. The eService system according to claim 11, wherein the eService provider is an acoustic service provider and the eService transmitter comprises a sound conductive rod or wire.

14. The eService system according to claim 11, wherein the eService provider is an illumination service provider and the eService transmitter comprises a light pipe.

* * * * *